United States Patent
Marx et al.

(10) Patent No.: US 6,373,247 B1
(45) Date of Patent: Apr. 16, 2002

(54) MAGNETORESISTIVE SENSOR ELEMENT WITH SELECTIVE MAGNETIZATION DIRECTION OF THE BIAS LAYER

(75) Inventors: Klaus Marx, Stuttgart; Hartmut Kittel, Weissach-Flacht; Franz Jost, Stuttgart; Martin Freitag, Gerlingen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/530,699

(22) PCT Filed: Jun. 2, 1999

(86) PCT No.: PCT/DE99/01631

§ 371 Date: May 3, 2000

§ 102(e) Date: May 3, 2000

(87) PCT Pub. No.: WO00/17667

PCT Pub. Date: Mar. 30, 2000

(30) Foreign Application Priority Data

Sep. 22, 1998 (DE) .......................................... 198 43 348

(51) Int. Cl.[7] .............................. G01B 7/14; G01R 33/02
(52) U.S. Cl. .............. 324/252; 324/207.21; 360/324.12
(58) Field of Search ....................... 324/207.21, 207.24, 324/207.25, 252; 338/321; 360/313–314, 324–326

(56) References Cited

U.S. PATENT DOCUMENTS 5,648,885 A * 7/1997 Nishioka et al. ............. 360/113
6,088,195 A * 7/2000 Kamiguchi et al. ......... 360/113

FOREIGN PATENT DOCUMENTS

DE 195 20 172 A 12/1996

OTHER PUBLICATIONS

Van Den Berg Ham et al: "GMR Angle Detector with an artificial Antiferromagnetic Subsystem (AAF)", Journal of Magnetism and Magnetic Materials, BD. 165, NR. 1, Jan. 1, 1997, pp. 524–528, XP004058131.
Patent Abstract of Japan Vo. 199, No. 709, Sep. 30, 1997 & JP 09 126780 A, Amy 16, 1997.

* cited by examiner

*Primary Examiner*—Jay Patidar
(74) *Attorney, Agent, or Firm*—Michael J. Striker

(57) ABSTRACT

A magnetoresistive sensor element, in particular an angle sensor element, has a first, magnetic layer (3) whose direction of magnetization represents a reference direction, a second, nonmagnetic layer (2) formed on the first layer (3), a third magnetic layer (1), formed on the second layer (2), whose direction of magnetization can be varied by an external magnetic field, and an additional layer consisting of a current conductor (5) for selective orientation of the direction of magnetization of the first layer (3). A current flow direction of an electric current that passes through the current conductor (5) can be switched to change the magnetization direction of the first magnetic layer (3) to create different reference directions. An insulation layer (4) for galvanic separation of the first magnetic layer (3) from the additional layer (5) is also provided between them.

7 Claims, 4 Drawing Sheets

MAGNETORESISTIVE SENSOR ELEMENT WITH SELECTIVE MAGNETIZATION DIRECTION OF THE BIAS LAYER

The present invention relates to a magnetoresistive sensor element, in particular an angle sensor element, as generically defined by the preamble to claim 1, and to a method for determining a direction of a magnetic field, as generically defined by the preamble to claim 6.

Sensors, in particular angle sensors, that operate on the basis of the magnetoresistive effect are known. In them, the electrical resistance of sensor elements is measured as a function of the direction of an external magnetic field. Especially the so-called AMR sensors, which exploit the anisotropic magnetoresistive effect, are used. Systems have also been described in which so-called GMR sensor elements (for giant magneto-resistance effect), especially using self-stabilizing magnetic layers, have been used (van den Berg et al, GMR angle detector with an artificial antiferromagnetic subsystem, Journal of Magnetism and Magnetic Materials 165 (1997) 524–528). Here a first thin, so-called reference direction is created by placing an antiferromagnetic coupling layer (of Cu or Ru, for instance) is placed between two oppositely magnetized layers (for instance of Co). The magnetic stability of the reference layer is enhanced by approximately one order of magnitude by this multilayered structure compared with individual Co layers. The direction of magnetization of the reference layer, the so-called reference direction, does not (in an ideal case) depend on the direction of the external magnetic field (the magnetic field to be measured).

The reference layer is covered with a thin nonmagnetic layer, over which in turn a thin soft magnetic layer, the so-called detection layer, is embodied. The detection layer orients its magnetization in the direction of an external magnetic field. It is known from the theory of the magnetoresistive effect that a sensor signal obeys a function $R(\alpha)=R_0+\Delta R^*\sin(\alpha)$, or $R(\alpha)=R_0+\Delta R^*\cos(\alpha)$, in which $R_0$ is an offset resistance, $\Delta R$ is a signal rise of the sensor, and a is the angle to be measured between a selected sensor direction (in particular the reference direction) and the direction of the external magnetic field.

Such AMR or GMR sensors can be used as 360° angle sensors only with major effort. In particular, achieving sufficiently precise measurement results requires interconnecting at least two sensor elements, whose respective sensor signals have to be linked by computer. When GMR materials are used, a destruction of the sensor function if the magnetic fields are too strong is also demonstrated.

Angle sensor elements operating on a Hall basis are also known, but typically they can cover an angular range of only 120°.

The object of the invention is therefore to create a sensor, in particular an angle sensor, with which the effort and expense for furnishing it and for measurement during operation can be reduced compared with conventional sensors.

This object is attained by a sensor element having the characteristics of claim 1 and by a method for determining the direction of a magnetic field having the characteristics of claim 6.

According to the invention, a sensor element or a sensor is now created that compared with conventional devices of this type has a substantially simpler structure that can be attained more economically. It is no longer necessary to interconnect a number of sensor elements; an angle to be measured can be ascertained in a simple way with only a single sensor element. Thus there is no need for expensively mounting a plurality of sensor elements on a substrate. The offset and sensitivity of the sensor element are improved, since there is no need to calibrate different sensor elements.

Preferred fields of use for the sensor element of the invention are steering wheel angle transducers for regulating the dynamics of motor vehicle operation, camshaft signal transducers, for example for controlling direct starting of an engine, throttle adjusting units, or sliding roof regulators.

Advantageous features of the sensor element and the method of the invention are the subject of the dependent claims.

It is especially preferred that the different reference directions be offset from one another by 90°. With this provision, linearly independent signals, in particular signals associated with the sine and cosine of the direction of rotation of the external magnetic field, can for instance be generated in a simple way. By using the arc tangent (arctan) function, it is then possible in a known manner at little expense to determine the direction of rotation or the angle of the external magnetic field with respect to a select direction, such as one of the two reference directions.

Expendiently, the means are formed by a current conductor, which is galvanically separated from the first layer by means for selective orientation of the direction of magnetization of an insulator layer and is embodied to carry current in different directions, in particular in directions offset by 90° from one another. With a so-called bias current of this kind, the selective orientation of the direction of magnetization can be attained in a simple and reliable way. Particularly by regulating the current intensity of the bias current, it is possible to adapt the sensor precision to the magnetic environment. No thermal drift in the sensor element occurs, since the bias current is constant over time or can easily be regulated to be constant. Since no hard magnetic material has to be used to create the reference magnetization, according to the invention in the event of strong magnetic fields there is no impairment or destruction of the sensor function. Such sensor elements have a wide temperature range in which they can be used and are usable in particular for motor vehicles.

Expediently, the first layer is made from a soft magnetic material. Such materials can be procured economically and can be magnetized by means of a current conductor-induced magnetic field (bias current).

Advantageously, the third layer, the detection layer of the sensor element, is also made from a soft magnetic material. This makes a precise, delay-free adaptation of the direction of magnetization of the detection layer to the direction of the external magnetic field attainable.

In a preferred embodiment of the method of the invention, one of the sensor signals is a signal associated with the sine of the angle between the first reference direction and the direction of magnetization of the third layer, and a further one of the sensor signals is a signal associated with the cosine of the angle between the first reference direction and the direction of magnetization of the third layer. Such signals can be evaluated in a simple way, especially using the arctan function.

The invention will now be described in detail in terms of a preferred exemplary embodiment in conjunction with the accompanying drawing, in which FIG. 1 is a schematic sectional view of the layered structure of a preferred embodiment of the sensor element of the invention;

Figure 1:
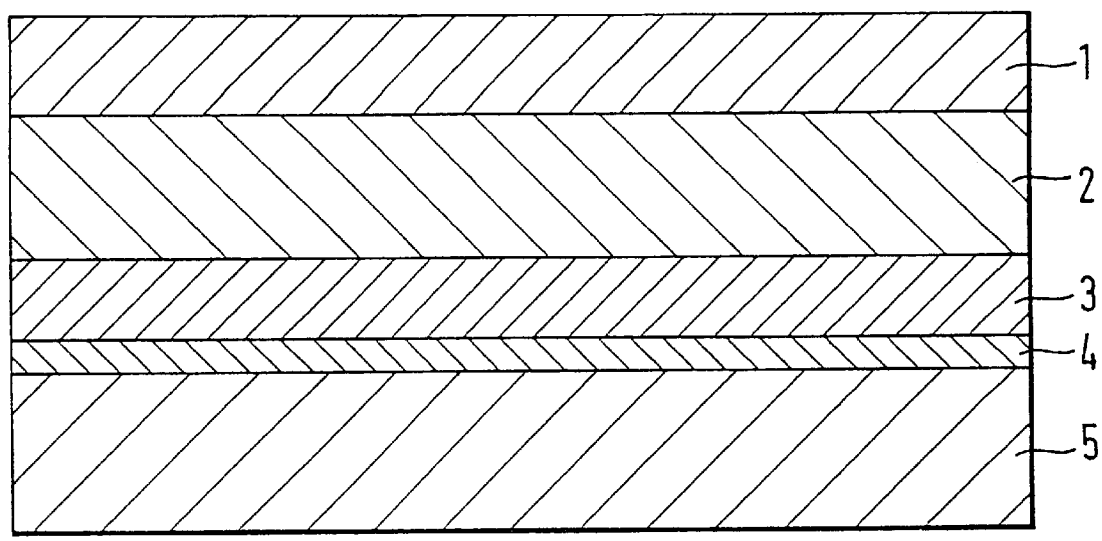

In FIG. 1, a preferred layered structure of the sensor element of the invention is shown schematically. The sensor element has a thin magnetic, preferably soft magnetic, layer 3 (reference layer 3). The direction of magnetization of this reference layer 3 is the reference direction of the sensor element. Over the reference layer 3, a thin, nonmagnetic conductor layer 2 is applied, over which a further, preferably soft magnetic layer 1 (detection layer) is embodied. The direction of magnetization of this detection layer 1 is dependent on the direction of an external magnetic field B (oriented parallel to the layer surface), as will be described hereinafter in detail.

Under the reference layer 3, an insulator layer 4 is formed, which galvanically separates the reference layer 3 from a layer 5 embodied as a current conductor. Depending on the direction of the current in the current conductor layer 5, a magnetic field is induced in the reference layer 3, which leads to a corresponding magnetization of the reference layer 3.

Figure 6:
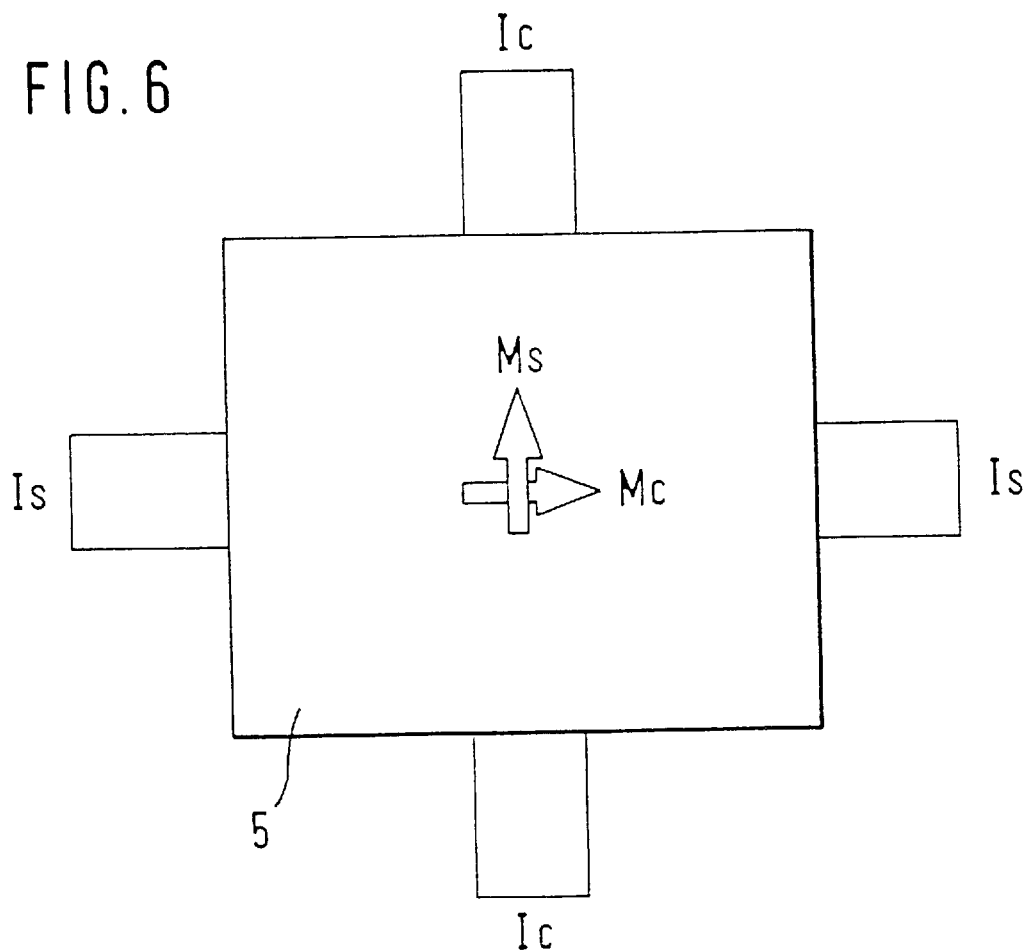
FIG. 6 is a plan view on one preferred embodiment of the current conductor layer of the sensor element of the invention (without the layers above it)

The relationship between the current direction in the layer 5 and the induced magnetization in the reference layer 3 is shown in FIG. 6. If a current Is as shown in FIG. 6 flows in the horizontal direction, then a magnetization corresponding to the direction represented by the arrow Ms is induced in the reference layer 3 disposed above it (not shown in FIG. 6). For a current flow Ic perpendicular to this, an analogous magnetization is obtained in the direction of the arrow Mc. For the sake of simplicity, both the directions of magnetization or directions of arrows representing magnetic fields and the corresponding magnetizations or magnetic fields will be designated with the same symbols.

Figure 7:
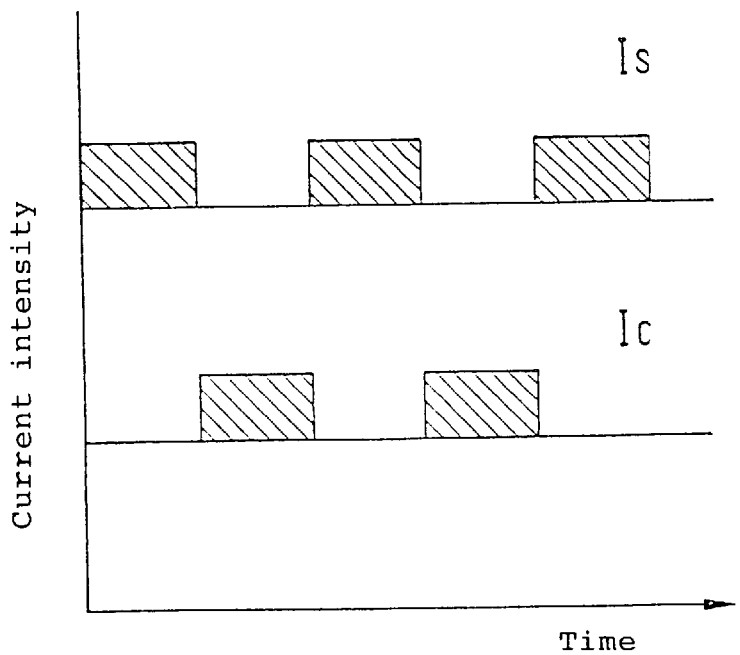
FIG. 7 is a graph explaining the imposition of current on the current conductor layer of FIG. 6.

A preferred triggering of the current conductor layer 5 is shown in FIG. 7. It can be seen that the current conductor layer 5 is subjected in alternation to the currents Is, Ic extending perpendicular to one another.

Figure 2:
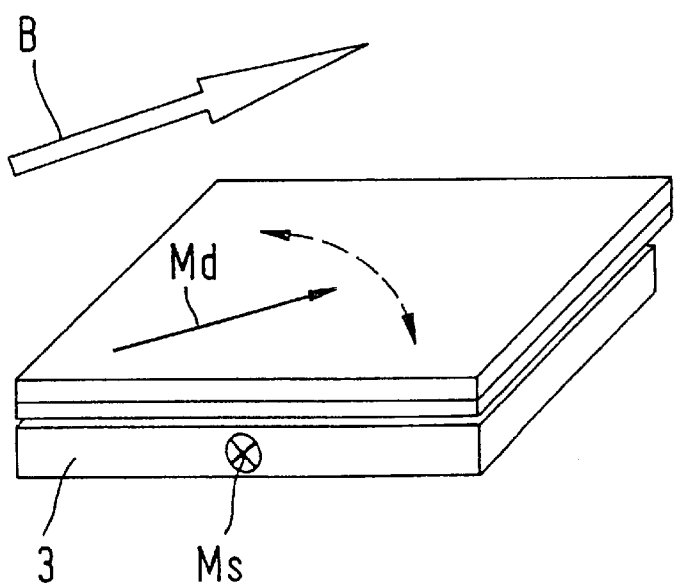
FIG. 2 is a perspective view of the top three layers of the sensor element of FIG. 1 with directions of magnetization indicated (first reference direction)

In FIG. 2, the magnetization Ms of the reference layer 3 upon application of the current Is is shown. In this view, the arrow Ms points into the plane of the drawing. The direction to be measured of the external magnetic field is represented by the arrow B. The magnetic field B causes a corresponding magnetization in the detection layer 1, the direction of which magnetization is indicated by the arrow Md. The magnetic field B and the magnetization Md of the detection layer have the same orientation.

Figure 3:
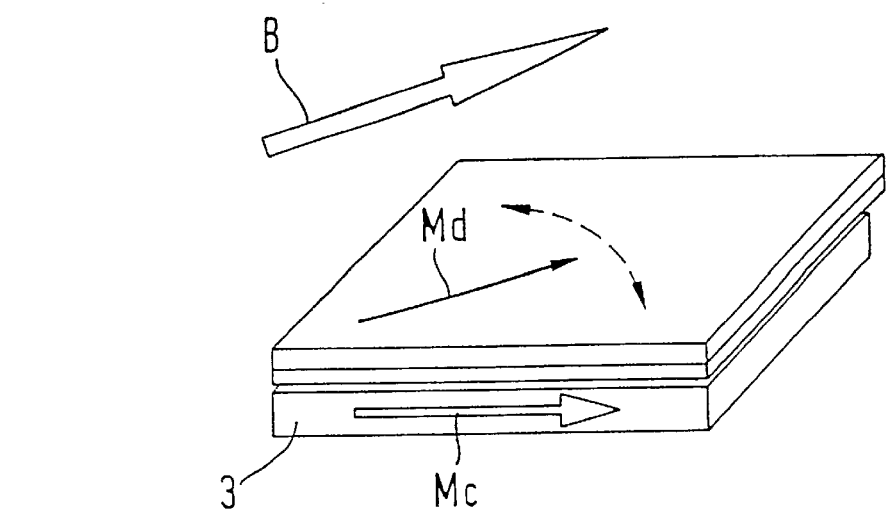
FIG. 3 is a perspective view of the top three layers of the sensor element of FIG. 1 with directions of magnetization indicated (second reference direction)

In FIG. 3, the arrow Mc representing the direction of magnetization of the reference layer 3 points in a direction parallel to the plane of the drawing. This magnetization is caused, as already explained, by the current Ic in the current conductor layer 5.

Figure 4:
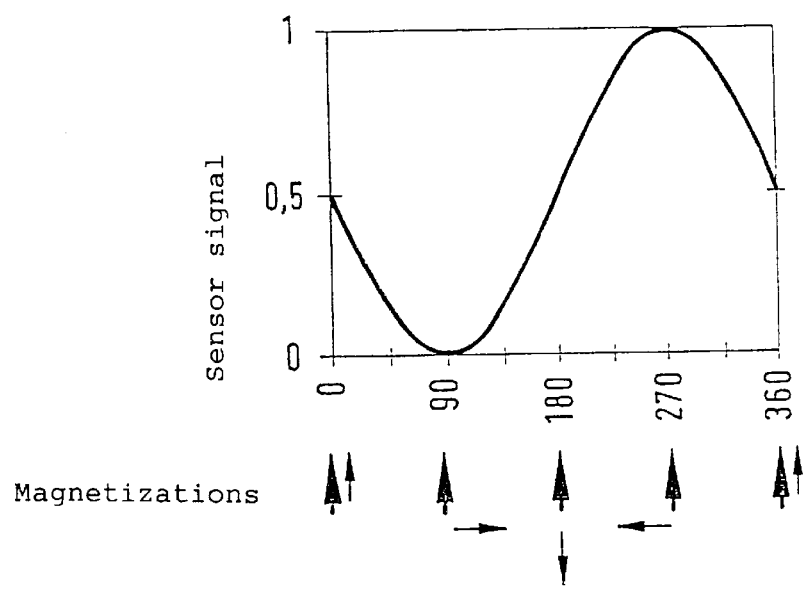
FIG. 4 shows the course of the sensor signal in the presence of the first reference direction.
Figure 5:
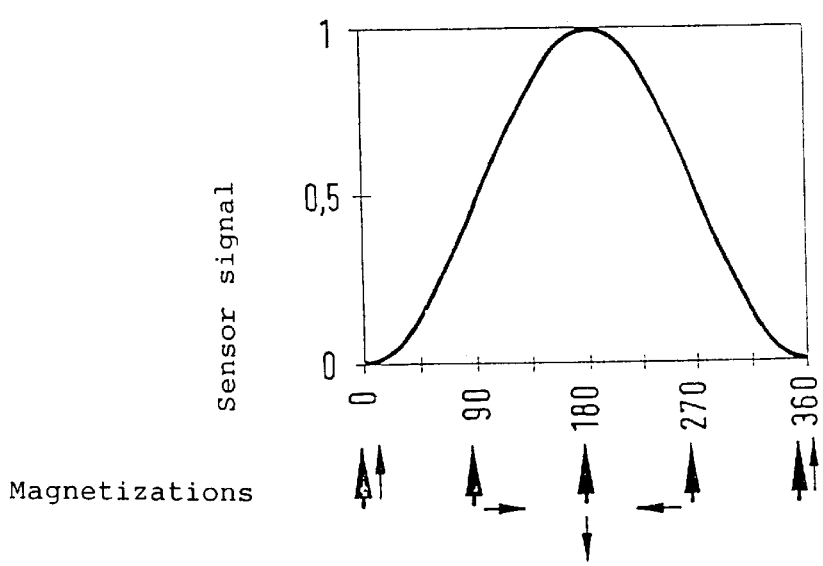
FIG. 5 shows the course of the sensor signal in the presence of the second reference direction.

A voltage signal generated by the sensor element (for instance when the magnetic field B is rotating) is dependent on the relative orientation of the magnetizations Ms, Md, and Mc, Md, respectively. For the reference layer magnetization Ms, this dependency is shown in FIG. 4, while for the reference layer magnetization Mc, it is shown in FIG. 5. For the sake of illustration, in addition to the various angles between the magnetizations, the magnetization Md is also represented by a large arrowhead, while the magnetizations Ms and Mc are represented by small arrowheads.

In FIG. 4, a sine-wave dependency of the sensor signal on the angle between the magnetizations Md and Ms can be seen, and in FIG. 5 correspondingly a cosine-wave dependency is seen between the magnetizations Md and Mc.

Overall, accordingly, for each angle between the external magnetic field B (or the direction of magnetization Md of the detector layer 1) and the sensor element, one signal dependent on the sine and one dependent on the cosine of this angle are obtained. With these two signals, and with the aid of the arc tangent function, the actual or mechanical angle between the external magnetic field B and an arbitrary selected direction, for instance one of two reference directions of the reference layer 3, can be determined. In conventional sensors, it was necessary to provide different, differently oriented sensor elements for both the sine signal and the cosine signal.

Figure 8:
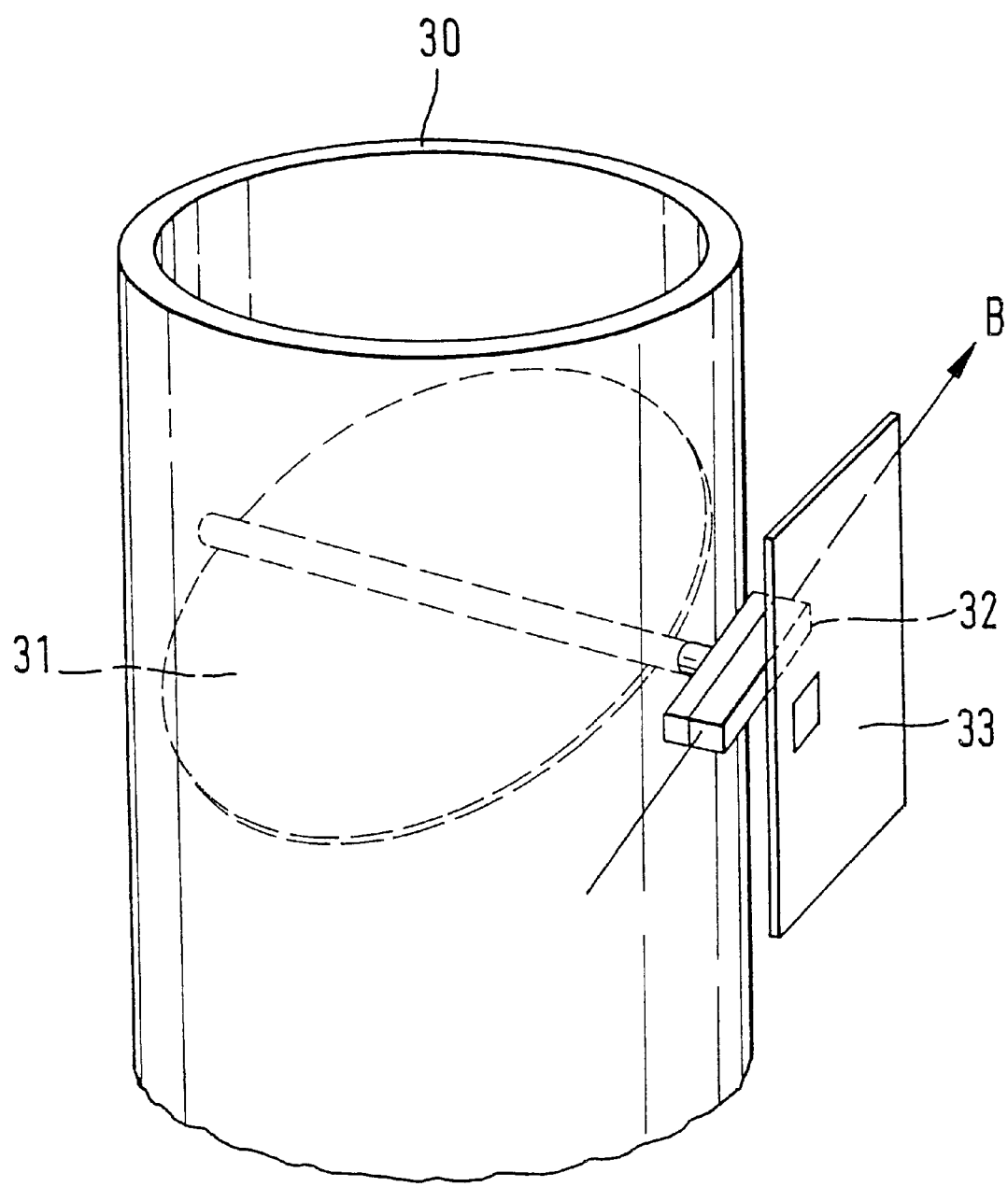
FIG. 8 is a perspective view of a preferred use of the sensor element of the invention.

Finally, from FIG. 8, a preferred example of use for the sensor element of the invention is shown. A throttle valve 31 provided in an intake tube 30 of an internal combustion engine has a magnet 32, on an extension embodied outside the intake tube; this magnet generates a magnetic field B in accordance with its orientation, which is dependent on the position of the throttle valve. A schematically shown (greatly enlarged) GMR sensor element 33 is disposed in the sphere of influence of this magnetic field B and it has a structure and mode of operation as described above. The magnetic field B is oriented parallel to the surface of the sensor element 33 (or to its detection layer, not shown). By means of only this single sensor element, the throttle valve angle of the throttle valve 31 can be determined as described in a simple way.

What is claimed is:

1. A magnetoresistive sensor element comprising
    a first magnetic layer (3) having a switchable magnetization direction representing a reference direction;
    a second nonmagnetic layer (2) formed on the first magnetic layer (3);
    a third magnetic layer (1) formed on the second nonmagnetic layer and having a variable magnetization direction according to an external magnetic field applied thereto;
    an additional layer (5) for selective orientation of said switchable magnetization direction of said first magnetic layer (3) according to a current flow direction of electrical current flowing through said additional layer (5), wherein said additional layer (5) is a current conductor; and
    an insulation layer (4) for galvanically separating the first magnetic layer (3) from said additional layer (5);
    whereby said reference direction is switched by changing said current flow direction of said electrical current flowing through said current conductor.

2. The magnetoresistive sensor element as defined in claim 1, wherein said electrical current flowing through said current conductor has two allowed current flow directions offset by 90°, whereby said reference direction has two allowed reference orientations offset by 90°.

3. The magnetoresistive sensor element as defined in claim 1, wherein said first magnetic layer (3) comprises a soft magnetic material.

4. The magnetoresistive sensor element as defined in claim 1, wherein said third magnetic layer (1) comprises a soft magnetic material.

5. The magnetoresistive sensor element as defined in claim 1, consisting of an angle sensor element.

6. A method for determining a direction of an applied magnetic field, said method comprising the steps of:

a) providing a magnetoresistive sensor element comprising a first magnetic layer (3) having a switchable magnetization direction representing a reference direction; a second nonmagnetic layer (2) formed on the first magnetic layer (3); a third magnetic layer (1) formed on the second nonmagnetic layer and having a variable magnetization direction induced by an external magnetic field applied thereto; an additional layer (5) for selective orientation of said switchable magnetization direction of said first magnetic layer (3) according to a current flow direction of electrical current flowing through said additional layer (5), wherein said additional layer (5) is a current conductor; and an insulation layer (4) for galvanically separating the first magnetic layer (3) from said additional layer (5);

b) changing the current flow direction of the electrical current flowing through the additional layer (5) from a first current flow direction to at least one other current flow direction to switch said reference direction between allowed magnetization orientations; and c) for each of said allowed magnetization orientations, measuring a sensor signal according an angle between said reference direction and a magnetization direction induced in said third magnetic layer (1) by said applied magnetic field.

7. The method as defined in claim 6, further comprising switching said current flow direction between said first current flow direction and a second current flow direction oriented at 90° with respect to said first current flow direction and wherein said sensor signal measured for said first current flow direction is associated with a sine of said angle between said reference direction produced by said first current flow direction and the magnetization direction of the third magnetic layer (1) induced by said external magnetic field and said sensor signal for said second current flow direction is associated with a cosine of the angle between said reference direction produced by said second current flow direction and the magnetization direction of the third magnetic layer (1) induced by said external magnetic field.

* * * * *